(12) United States Patent
O'Brien et al.

(10) Patent No.: US 6,458,711 B1
(45) Date of Patent: Oct. 1, 2002

(54) SELF-ALIGNED SILICIDE PROCESS

(75) Inventors: Sean C. O'Brien, Plano; Douglas A. Prinslow, McKinney, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 402 days.

(21) Appl. No.: 09/045,009

(22) Filed: Mar. 20, 1998

Related U.S. Application Data

(60) Provisional application No. 60/040,867, filed on Mar. 20, 1997.
(51) Int. Cl.[7] ............................................. H01L 21/302
(52) U.S. Cl. ................. 438/745; 438/753; 438/754; 438/755
(58) Field of Search ........................... 438/200, 34, 43, 438/301, 753, 755, 745, 754

(56) References Cited

U.S. PATENT DOCUMENTS

| | | | | |
|---|---|---|---|---|
| 5,387,535 A | * | 2/1995 | Wilmsmeyer | 438/621 |
| 5,527,745 A | * | 6/1996 | Dixit et al. | 438/600 |
| 5,576,244 A | * | 11/1996 | Hayashi | 438/301 |
| 5,668,065 A | * | 9/1997 | Lin | 438/303 |

* cited by examiner

*Primary Examiner*—Benjamin L. Utech
*Assistant Examiner*—Binh X. Tran
(74) *Attorney, Agent, or Firm*—Carlton H. Hoel; W. James Brady; Frederick J. Telecky, Jr.

(57) ABSTRACT

A self-aligned silicide process with a selective etch of unreacted metal (plus any nitride) with respect to silicide plus a two step process of highly selective strip of unreacted metal (plus any nitride) followed by a silicide etch to remove unwanted silicide filament.

12 Claims, 2 Drawing Sheets

SELF-ALIGNED SILICIDE PROCESS

CROSS-REFERENCE TO RELATED APPLICATIONS

This application claims priority under 35 USC § 119(e)(1) of provisional application No. 60/040,867 filed Mar. 20, 1997.

Copending U.S. patent applications Ser. Nos. 08/670,380 and 08/670,381, both filed Jun. 25, 1996, disclose related subject matter and have a common assignee with the present application.

BACKGROUND OF THE INVENTION

The invention relates to electronic semiconductor devices, and, more particularly, to fabrication methods for such devices.

Semiconductor integrated circuits with high device density require minimum size structures such as short gates and shallow source/drain junctions for field effect transistors ("FET"s), small area emitters for bipolar transistors, and narrow interconnect lines between devices. Short gates and narrow interconnect lines lead to higher resistance for the typical polysilicon gates and first level interconnect lines, and this increases RC time delays and slows circuit operation.

One approach to reduce the resistance of polysilicon gates and interconnect lines uses a self-aligned metal silicide on top of the polysilicon; the metal may be refractory metals such as titanium, cobalt, and nickel. The silicidation process first deposits a blanket film of metal and then reacts the metal with any underlying silicon but not with underlying insulator such as silicon oxide (a nitrogen atmosphere may be used to simultaneously form the metal nitride to inhibit silicon diffusion). Lastly, the process removes the metal (plus any metal nitride) which did not become silicide. For example, U.S. Pat. No. 4,821,085 discloses titanium metal and reaction in a nitrogen atmosphere which forms titanium nitride where silicide does not form. The removal of metal (and metal nitride) in this self-aligned silicide process requires a high selectivity with respect to removal of the metal silicide, otherwise the metal silicide will be thinned and lose the advantages of siliciding. For example, the stripping of titanium nitride with the standard basic SC1 solution (12.5% ammonium hydroxide solution, 12.5% hydrogen peroxide solution, and 75% water) at room temperature has a selectivity with respect to titanium silicide of roughly 7.8 to 1. This selectively presents problems in the known silicide processes.

SUMMARY OF THE INVENTION

The present invention provides a highly selective strip of titanium nitride and titanium metal with respect to titanium silicide by the use of a basic solution with a large hydrogen peroxide to ammonium hydroxide ratio.

Further, the present invention provides a two step strip of metal and metal nitride while leaving metal silicide by a near perfect selectivity strip of the metal (including cobalt, nickel, and titanium) and metal nitrides with respect to the corresponding metal silicide followed by a brief etching of the metal slicide.

Preferred embodiments use a first acidic stripping of titanium, titanium nitride, cobalt, and nickel, such as with standard SC2 (solution of hydrochloric acid and hydrogen peroxide in water) or ozonated sulfuric acid to provide selectivity of greater than 100 to 1 with respect to the corresponding silicide, plua a short second etch of the silicide. The second step removes unwanted silicide which has formed on insulators.

A silicide phase conversion step may be inserted between the metal/nitride and silicide etches.

Advantages include simplicity of the removal of metal/nitride with high selectivity to the silicide for titanium, cobalt, and nickel.

BRIEF DESCRIPTION OF THE DRAWINGS

The drawings are heuristic for clarity.

DESCRIPTION OF THE PREFERRED EMBODIMENTS

Overview

Figure 1A:
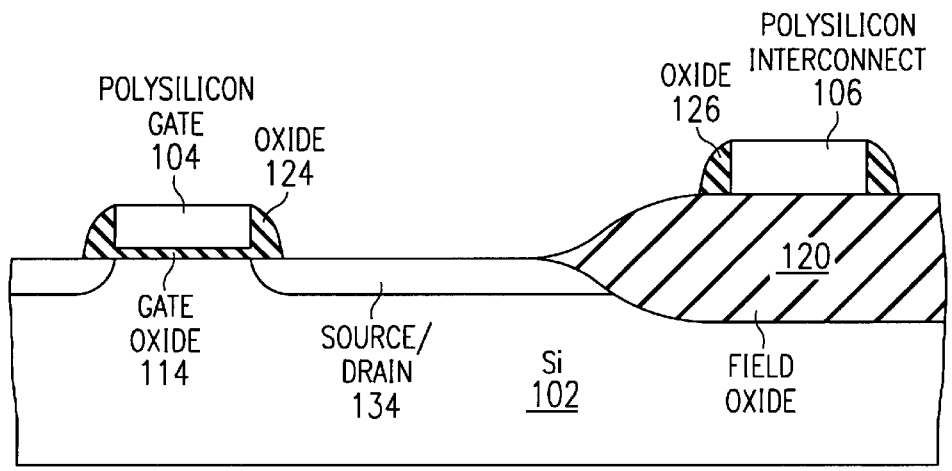
FIGS. 1a–d illustrate in cross sectional elevation views steps of a first preferred embodiment method.
Figure 1B:
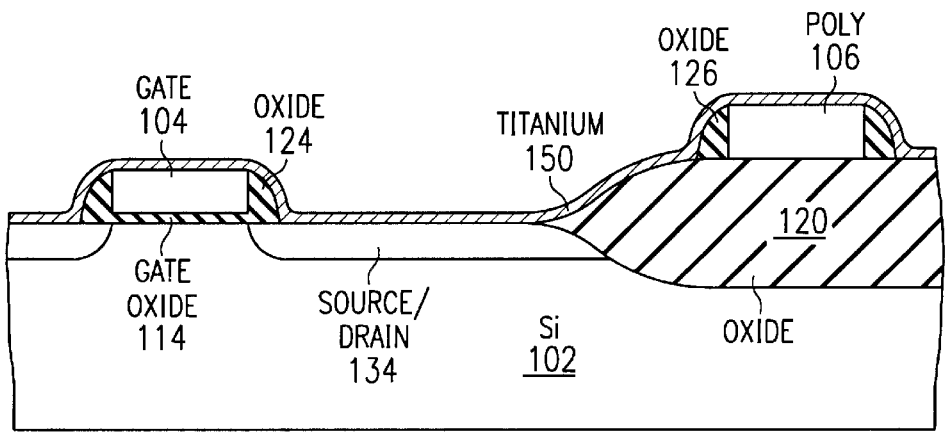

The preferred embodiment methods strip titanium nitride (TiN) and titanium metal (Ti) selectivity (20-to-1) with respect to titanium silicide (TiSi$_2$) with essentially a 30% hydrogen peroxide (H$_2$O$_2$) solution in water. Stripping with solution temperatures of about 55° C. gives practical etch rates.

Some etching of TiSi$_2$ may be desired, such as removal of unwanted filaments which form during the siliciding process. Some preferred embodiments thus include a second strip with a solution containing both H$_2$O$_2$ and ammonium hydroxide (NH$_4$OH) to be applied after the anneal which converts small grain C49 phase TiSi$_2$ to large grain C54 phase TiSi$_2$. Narrow filaments convert very slowly and the solution selectively strips C49 phase with respect to C54 phase.

Also, two step etch preferred embodiments for titanium, cobalt, and nickel silicidations use a first acidic strip of unreacted metal (plus any nitrides formed due to a nitrogen reaction atmosphere) with a selectivity of 100 to 1 and then a second etching of the silicide to remove any unwanted silicide, such as silicide filaments on the insulator. This second etch is time limited to only remove about 5% of the thickness of the desired silicide.

First preferred embodiment

FIGS. 1a–d illustrate in cross sectional elevation views the first preferred embodiment self-aligned titanium silicide method which includes the following steps. (1) Start with silicon substrate 102 having polysilicon gate 104 on gate insulator silicon dioxide (gate oxide) 114 with gate 104 having sidewall oxide 124 for alignment of source/drains 134 and with field oxide 120 for transistor isolation. Also, polysilicon interconnect line 106 with sidewall oxide 126 may run over field oxide 120. Typically, the polysilicon gates and the field oxide each extend about 0.3 μm above the substrate surface, so the top of poly interconnect 108 lies about 0.6 μm above the substrate surface. Gate oxide 114 may be about 6 nm thick and source/drains 134 about 0.15 μm deep. See FIG. 1a which illustrates a gate length and poly interconnect width of roughly 0.5 μm.

(2) Sputter deposit titanium 150 to a thickness of about 60 nm. Titanium 150 coverage on the sloping sidewall oxides 124–126 and field oxide 120 is not crucial because this portion of titanium 150 will not form TiSi$_2$ and will be stripped in a subsequent step. See FIG. 1b.

(3) Insert the titanium coated substrate into a nitrogen (plus optional hydrogen) atmosphere and raise the temperature to roughly 600° C. to drive the silicidation reaction for the portion of titanium 150 abutting silicon; namely, the surfaces of gate 104, poly interconnect 106, and source/drain 134:

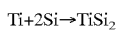

Silicon diffuses through TiSi$_2$, so the TiSi$_2$ grows from gate 104, poly 106, and source/drain 134. (This TiSi$_2$ is the metastable C49 phase and will be converted to the stable C54 phase in a subsequent anneal.) A competing reaction with the nitrogen from the atmosphere diffusing into the titanium limits the TiSi$_2$ growth:

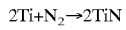

$$2Ti+N_2 \rightarrow 2TiN$$

The titanium on oxides 120, 124, and 126 only slightly reduces the abutting oxide before nitrogen diffusing from the atmosphere will convert the titanium to TiN. Thus only a small amount of titanium oxide forms:

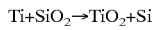

$$Ti+SiO_2 \rightarrow TiO_2+Si$$

Figure 1C:
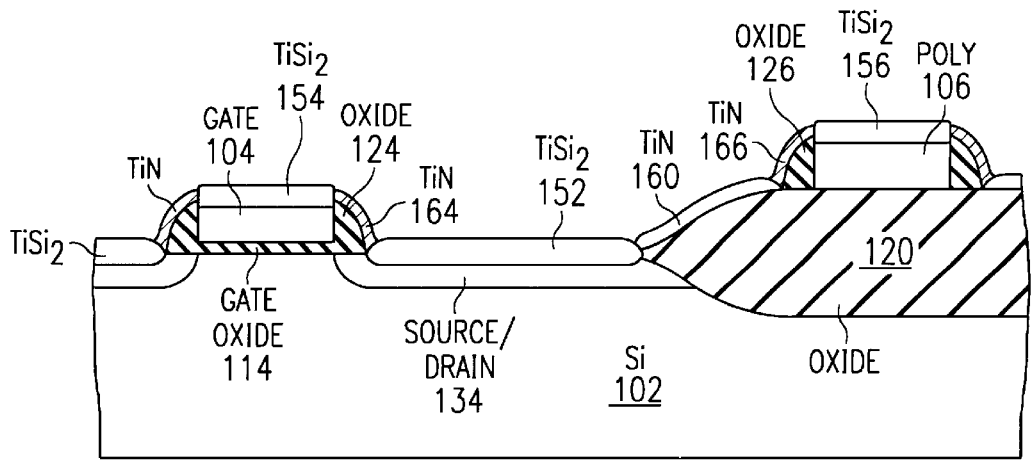
Figure 1D:
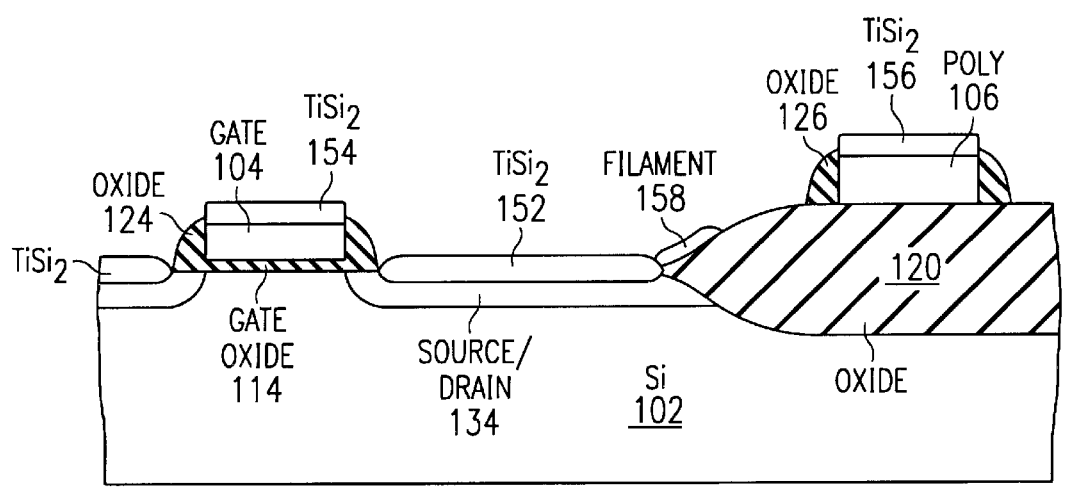

And some titanium remains unreacted as Ti metal. See FIG. 1c showing TiSi$_2$ 152 formed on source/drain 134, TiSi$_2$ 154–156 formed on gate 104 and poly 106, and TiN 160–164–166 formed on oxides 120–124–126. The top surfaces of TiSi$_2$ 152–154–156 typically contain some TiN which forms prior to the diffusing silicon arriving to form silicide. The TiSi$_2$ will be roughly 80 nm thick and the TiN roughly 60 nm thick. Thus the selectivity of only 7.8 to 1 for SC1 stripping of the TiN with a 100% overetch would remove roughly 15 nm of TiSi$_2$, or about 20%.

(4) Immerse the silicided/nitrided substrate in a solution of 30% H$_2$O$_2$ and 70% H$_2$O at 55° C. for roughly 15 minutes. This solution has an etch rate for TiN of about 8 nm/min, so the 15 minute etch equals a 100% overetch. The selectivity with respect to TiSi$_2$ roughly equals 35 to 1 (a TiSi$_2$ etch rate of roughly 0.25 nm/min), so the TiN strip removes roughly 4 nm of TiSi$_2$, or 5%. H$_2$O$_2$ also strips any residual Ti metal and thin TiO$_2$ on oxides 120–124–126. See FIG. 1d.

(5) Lastly, rinse the silicided substrate clean and then anneal in a forming gas (nitrogen plus hydrogen) atmosphere at about 750° C. to convert the TiSi$_2$ from metastable C49 phase to stable C54 phase and thereby lower the resistivity from roughly 75 microohm-cm to roughly 15 microohm-cm. This completes the siliciding, and further steps of forming metal level interconnects, passivation, wire bonding, and packaging complete the integrated circuit.

Graphical representation

Figure 2:
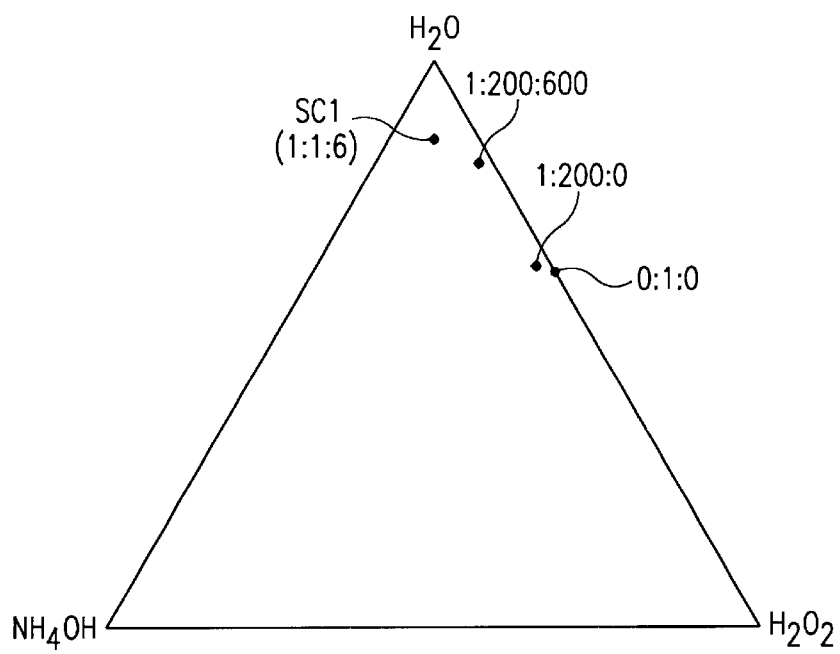
FIG. 2 is a component diagram showing various solutions.

The preferred embodiment stripping solution may be modified while retaining high selectivity of TiN with respect to TiSi$_2$. In particular, FIG. 2 is a component diagram graphically showing the portions of each of the three components (NH$_4$OH, H$_2$O$_2$, and H$_2$O) of possible stripping solutions. Recall that NH$_4$OH is typically provided as a 29% by weight solution with water (also expressed as 14% by weight NH$_3$) and that H$_2$O$_2$ is typically provided as a 30% by weight solution with water. Thus the point labelled SC1 in FIG. 2 depicts a solution with a volume ratio of 1:1:6 of 29% NH$_4$OH solution to 30% H$_2$O$_2$ solution to H$_2$O. Similarly, the other data points in FIG. 2 have labels reflecting their volume ratios of 29% NH$_4$OH solution to 30% H$_2$O$_2$ solution to H$_2$O, respectively. The following table shows the TiN etch rate and selectivity with respect to TiSi$_2$ (C49 phase) of these solutions.

| Solution | TiN etch rate (nm/min) | Selectivity |
| --- | --- | --- |
| 1:1:6 (SC1) at 27° C. | 5.7 | 7.8 |
| 1:200:600 at 27° C. | 3.5 | 11.3 |
| 1:200:600 at 55° C. | 13 | 11.0 |
| 1:200:0 at 55° C. | 28 | 20.1 |
| 1:200:0 at 40° C. | 6.7 | 16.6 |
| 0:1:0 at 55° C. | 8.0 | 35 |

The first two entries show a replacement of almost all of the NH$_4$OH by H$_2$O$_2$ in SC1 at room temperature decreases the TiN etch rate but increases selectivity somewhat. The second and third entries indicate a temperature independent selectivity but increased TiN etch rate for the NH$_4$OH mostly replaced by H$_2$O$_2$ in SC1. The third and fourth entries show increasing H$_2$O$_2$ (and minimal NH$_4$OH) concentration increases TiN etch rate plus nearly doubles the selectivity. The fourth and fifth entries shows a small temperature increase in selectivity but large increase in TiN etch rate. And the fourth plus sixth entries illustrate elimination of all NH$_4$OH decreases TiN etch rate by a factor of more than 3 but almost doubles selectivity. In summary, limiting or omitting the metal-complexing ammonium ion provides a tradeoff of decreased etch rates of both TiN and TiSi$_2$ but increased selectivity of etching TiN over TiSi$_2$. And a temperature increase can compensate for the decrease in etch rate of TiN. Thus a selectivity can be picked and the etch rate adjusted by temperature. For example, replacing almost all of the ammonia of SC1 with peroxide (i.e., the 1:200:600 solution) yields better than a 10 to 1 selectivity, and then removing water from this solution (i.e., the 1:200:0 solution) raises the selectivity to better than 20 to 1 at 55° C.

Second preferred embodiment

A second preferred embodiment method follows steps (1)–(5) of the first preferred embodiment but adds a TiSi$_2$ filament strip with SC1 after the annealling in step (5). That is, anneal to convert TiSi$_2$ from higher-resistivity metastable C49 phase to lower-resistivity stable C54 phase, and then strip unconverted TiSi$_2$ remaining in the C49 phase by immersing in a solution of SC1 at room temperature. SC1 etches C49 phase at about 0.73 nm/min but only etches the C54 phase at about 0.2 nm/min. TiSi$_2$ 152–154–156 on the gates, lines, and source/drains will generally be C54 phase, but narrow filaments (e.g., filament 158 in FIG. 1d) of TiSi$_2$ on oxides 120, 124, or 126 would be too narrow to convert to C54 phase during the anneal and remain as C49 phase which is etched away by SC1 in a few minutes. Indeed, the C49 grains may average about 0.1–0.2 μm diameter; and the phase conversion time (time to convert half from C49 to C54) roughly depends upon $g^2/(w-g)$ where g is the grain size and w is the filament width. So narrow filaments have a very long conversion time.

The delay of the TiSi$_2$ filament etch until after the phase conversion anneal (rather than at the same time as the TiN strip) allows the use of the highly selective H$_2$O$_2$ TiN strip and consequent minimal loss of TiSi$_2$ on the gates, lines, and source/drains.

Third preferred embodiment

Because the selectivity of etching TiN relative to TiSi$_2$ increases with decreasing NH$_4$OH and the etch rate increases with increasing H$_2$O$_2$ concentration, the third preferred embodiment uses a solution of greater than 30% H$_2$O$_2$ without any NH$_4$OH. Indeed, H$_2$O$_2$ is a liquid with melting point about 0° C. and boiling point about 150° C. and miscible with water, so any concentration can be achieved.

SC1 preferrede embodiment

A further titanium perferred embodiment uses an acidic TiN strip followed by the phase conversion anneal and lastly the unconverted suicide filament etch with SC1. In particular, follow the first preferred embodiment steps to react the titanium with the silicon, but strip the TiN and unreacted Ti with a solution of HCl and H$_2$O$_2$ in water such as standard SC2. Indeed, the ratio of HCl:H$_2$O$_2$:H$_2$O may be in the range of 1:1:100 to 1:1:5. The selectivity of etching TiN with respect to TiSi$_2$ is greater than 100 to 1.

Following the phase conversion anneal (or before the phase conversion anneal), etch silicide filaments with an SC1 solution as in the preceding embodiment.

Cobalt preferred embodiment

Another preferred embodiment uses cobalt in place of the titanium of the foregoing preferred embodiments and proceeds with analogously steps. In particular, start with a wafer having structures as in FIG. 1a and sputter deposit cobalt to provide a structure similar to that of FIG. 1b but with cobalt in place of titanium 150. Then react the cobalt with underlying silicon at 600° C. in an atmosphere of nitrogen. The cobalt diffuses through the silicide rather than the silicon diffusing through, so the reaction does not need an atmosphere which can interact with the cobalt and stop silicide growth over the oxide. The reaction is:

$$Co+2Si \rightarrow CoSi_2$$

The other silicides, $Co_2Si$ and $CoSi$, do not appear. This yields a structure analogous to that of FIG. 1c but with $CoSi_2$ in place of $TiSi_2$ and Co in place of TiN.

After the silicide formation, strip the unreacted cobalt by immersion of the wafer in a solution of sulfuric acid and $H_2O_2$ in a ratio of 5 to 1 (solutions in the range of about 10 to 1 down to about 2 to 1 also work well) at 90° C. The strip selectivity of Co to $CoSi_2$ is about 100 to 1. Thus stripping 50 nm of Co will only remove about 0.5 nm of $CoSi_2$ out of an initial 100 nm.

An anneal at 800° C. may be used to insure formation of large $CoSi_2$ grains (single crystal in narrow regions) for low resistivity.

Lastly, briefly etch the $CoSi_2$ to remove any unwanted filaments. The etch may be by immersion in a solution of HF and $NH_4F$. Remove about 5% of the thickness of the $CoSi_2$ to insure elimination of filaments.

Nickel preferred embodiment

A further preferred embodiment uses nickel in place of the cobalt of the preceding preferred embodiment and proceeds with analogous steps. In particular, start with a wafer having structures as in FIG. 1a and sputter deposit nickel to provide a structure similar to that of FIG. 1b but with nickel in place of titanium 150. Then react the nickel with underlying silicon at about 450° C. in an inert atomosphere such as nitrogen or argon. The nickel diffuses through the silicide rather than the silicon diffusing through, so the reaction does not need an atmosphere which can interact with the nickel and stop silicide growth over the oxide. The reaction is:

$$Ni+2Si \rightarrow NiSi_2$$

$Ni_2Si$ does not form. The reaction yields a structure analogous to that of FIG. 1c but with $NiSi_2$ in place of $TiSi_2$ and Ni in place of TiN.

After the suicide formation, strip the unreacted nickel by immersion of the wafer in a solution of ozonated sulfuric acid ($O_3$ bubbled through $H_2SO_4$) at 90° C. The strip selectivity of Ni to $NiSi_2$ is likely high (100 to 1) and stripping 60 nm of Ni will likely remove less than 1 nm of $NiSi_2$ out of an initial 100 nm.

$NiSi_2$ does not need any anneal to increase grain size for low resistivity.

Lastly, briefly etch the silicide to remove any unwanted filaments. The etch may be by immersion in a solution such as buffered HF. Remove about 5% of the thickness of the silicide to insure elimination of filaments.

Modifications and variations

The preferred embodiments may be varied in many ways while retaining one or more of the features of a metal/nitride strip selective to silicide, optionally followed by an anneal, and then followed by a silicide etch to insure filament removal.

For example, the various strip solutions may be used with each of the metals; the temperatures and concentrations of the strip solutions may be varied provided the desired selectivity is maintained, such as at least 10 to 1 or at least 20 to 1 in the titanium nitride strip; the selectivity of C49 phase to C54 phase etching is easily maintained. Further, the thicknesses and widths of the titanium layer and resulting reaction product TiN and $TiSi_2$ may be varied; the reaction temperature may be varied and include rapid thermal annealing; the phase conversion temperature may be varied. Similarly, the solutions and temperatures of the cobalt and nickel preferred embodiments may be varied provided selectivity is retained. And the structures on which self-aligned silicidation could be varied such as the silicon oxide regions could be replaced by or supplemented by regions of silicon nitride, silicon oxynitride, or other nonreactive regions.

What is claimed is:

1. A method of self-aligned silicidation, comprising the steps of:
   (a) forming a metal layer on a wafer surface which includes silicon areas and nonsilicon areas;
   (b) reacting first portions of said metal layer with said silicon areas to form metal silicide;
   (c) removing second portions of said metal layer which did not react in step (b) to form metal silicide by use of a first etchant with selectivity with respect to said metal silicide of at least 10 to 1;
   (d) after step (c) removing portions of said metal silicide with a second etchant.

2. The method of claim 1, wherein:
   (a) said metal is selected from the group consisting of titanium, cobalt, and nickel.

3. The method of claim 1, wherein:
   (a) said metal is titanium;
   (b) said reacting of step (b) is in a nitrogen atmosphere; and
   (c) said stripping of step (c) removes TiN.

4. The method of claim 1, wherein:
   (a) said first etchant of step (c) is a solution of $H_2SO_4$ and $H_2O_2$ with the ratio of $H_2SO_4$ to $H_2O_2$ the range from 10:1 to 2:1.

5. The method of claim 1, wherein:
   (a) said first etchant of step (c) is sulfuric acid through which ozone is bubbled.

6. The method of claim 1, wherein:
   (a) said first etchant of step (c) is a solution of HCl, $H_2O_2$, and $H_2O$ with the ratio of components in the range from 1:1:100 to 1:1:5.

7. The method of claim 1, wherein:
   (a) said second etchant of step (d) is a solution of $H_2O$, $H_2O_2$, and $NH_4OH$.

8. The method of claim 1, comprising the further step of:
   (a) between said steps (c) and (d) of claim 1 annealing said wafer.

9. The method of claim 1, comprising the further step of:
   (a) after said step (d) of claim 1 annealing said wafer.

10. The method of claim 1, comprising the further step of:
    (a) between said steps (c) and (d) of claim 1 drying said wafer.

11. The method of claim 1, wherein:
    (a) said first etchant of step (c) is a solution of $H_2O$, $H_2O_2$, and $NH_4OH$ with the ratio of $NH_4OH$ to $H_2O_2$ of less than 1:200.

12. The method of claim 11, wherein:
    (a) said ratio is equal to 0.

* * * * *